United States Patent [19]
Chan

[11] Patent Number: 6,013,952
[45] Date of Patent: Jan. 11, 2000

[54] STRUCTURE AND METHOD FOR MEASURING INTERFACE RESISTANCE IN MULTIPLE INTERFACE CONTACTS AND VIA STRUCTURES IN SEMICONDUCTOR DEVICES

[75] Inventor: Kam-Kee Victer Chan, San Jose, Calif.

[73] Assignee: LSI Logic Corporation, Milpitas, Calif.

[21] Appl. No.: 09/046,113

[22] Filed: Mar. 20, 1998

[51] Int. Cl.[7] .......................... H01L 23/48; H01L 23/52; H01L 29/40

[52] U.S. Cl. ........................ 257/773; 257/750; 257/758; 257/784

[58] Field of Search .................. 257/773, 750, 257/758, 786, 774, 781, 784; 438/622, 626

[56] References Cited

U.S. PATENT DOCUMENTS

| | | | |
|---|---|---|---|
| 5,287,002 | 2/1994 | Freeman et al. | 257/781 |
| 5,485,038 | 1/1996 | Licari et al. | 257/758 |
| 5,585,676 | 12/1996 | Uda et al. | 257/786 |
| 5,721,453 | 2/1998 | Imai et al. | 257/774 |
| 5,742,094 | 4/1998 | Ting | 257/786 |
| 5,838,023 | 11/1998 | Goel et al. | 257/758 |
| 5,847,466 | 12/1998 | Ito et al. | 257/774 |

FOREIGN PATENT DOCUMENTS

| | | | |
|---|---|---|---|
| 0 206 337 | 12/1986 | European Pat. Off. | 257/786 |
| 5-109924 | 4/1993 | Japan | 257/786 |

*Primary Examiner*—Mahshid Saadat
*Assistant Examiner*—Jhihan B Clark

[57] ABSTRACT

A structure and method is shown for measuring a plug and interface resistance values of an inter-layer contact structure in a semiconductor device. An inter-layer contact plug interconnects two metal layers in the semiconductor device forming a pair of plug to metal layer interfaces. A conductive trace is formed in an inter-metal dielectric layer between the metal layers, where the conductive trace couples the conductive plug to a pair of externally accessible pads. Each of the metal layers has a pair of pads. Using the pads coupled to the conductive trace, current is forced through each of the plug to metal interfaces and a voltage difference across each interface is measured in order to obtain the resistance of each interface. The total resistance of the inter-layer contact plug is similarly obtained and the resistance of the plug itself is obtained by subtracting the resistance of the two interfaces from the total resistance. The present invention enables the resistance of each of the interfaces and the plug to be separately determined to aid in troubleshooting a fabrication process used to form the metal layers and inter-layer contact structure of the semiconductor device.

3 Claims, 5 Drawing Sheets

STRUCTURE AND METHOD FOR MEASURING INTERFACE RESISTANCE IN MULTIPLE INTERFACE CONTACTS AND VIA STRUCTURES IN SEMICONDUCTOR DEVICES

FIELD OF THE INVENTION

The present invention relates generally to determining the contact and via interface resistance within a multiple interface contact or via structure in semiconductor devices.

BACKGROUND OF THE INVENTION

Advance semiconductor processing techniques currently employed often involve the use of multiple metallization layers. These layers are used to interconnect active devices in a semiconductor circuit. Metal traces formed in the metallization layers also must be interconnected in order to pass signals from one metal layer to the next. Interconnections between the metallization layers are typically accomplished through the formation of conductive vias or plugs between the metal layers.

FIG. 1 illustrates an example of an interconnect structure 10 formed by a plug 14 between a Metal 1 (M1) layer 16 and a Metal 2 (M2) layer 12. The metal layers are typically composed of aluminum while the plug 14 is typically formed using a different type of conductive material such as tungsten. Because the plug 14 is a formed from a different material using a different fabrication step, there are two interfaces formed which have resistance associated with them: the interface I1 between the plug and Metal 1 and the interface I2 between the plug and Metal 2.

FIGS. 2A–C illustrate a typical example of the process for forming plug 14. Once the Metal 1 layer 16 has been formed on a semiconductor substrate (not shown), an inter-metal dielectric (IMD) layer 20 is formed on top of the Metal 1 layer and etched to form a trough 22, as shown in FIG. 2A. A tungsten layer 24 is then formed on top of the IMD layer 20 which fills the trench to form the plug 14, as shown in FIG. 2B. The tungsten layer 24 is then lapped, through a process such as chemical-mechanical polishing (CMP), or etched-back to remove the excess tungsten but, ideally, leaving the trough filled with tungsten to form plug 14. The Metal 2 layer 16 is then formed on top of the IMD layer 20 and the plug 14.

However, variations and errors in processing parameters causes large variations in the resistance of the plug 14 and the interfaces I1 and I2. For instance, excessive amounts of chemical or pressure in a CMP polishing step may remove too much tungsten material from plug 14 resulting in a depression or divot at the interface between the plug and the metallization layer formed on top of the plug and its associated IMD layer. The metal protruding into the divot at the top of the plug has greater surface contact area with the plug than would a normal plug that was flush with the surface of the IMD layer. If, however, the divot is sufficiently large, then the loss of conductive material in the plug can lead to greater resistance of the plug itself. These problems can be detected by observing the resistance of the I2 interface.

Also, vias or plugs are often stacked on top of one another in successive metallization layers. As a result, problems in earlier processing steps can accumulate in the upper metallization layers causing variations in the plugs between the upper metallization layers and often result in voids, such as void 26 illustrated in FIG. 2C, in these upper layer plugs. A void or trough in a plug can be detected through measurement of the resistance of the plug itself.

The resistance of plugs is typically measured to detect problems with the plugs, such as those described above, arising during the manufacturing process. FIG. 3 illustrates a top view of the structure typically used to measure the resistance of a plug. The M1 layer 16 has two pads A and C that are externally accessible for the purposes of test. The M2 layer 12 also has two pads B and D that are externally accessible for the purposes of test. The plug 14 interconnects the M1 layer 16 to the M2 layer 12.

In the conventional structure of FIG. 3, two measurements are typically taken. For the first measurement, a current source is coupled between pads A and B and the voltage is measured between pads C and D to obtain the cumulative resistance of plug 14 and the interfaces I1 and I2. Then the process is repeated with the current source coupled between pads C and D and the voltage measured between pads A and B. The two measurements are averaged to compensate for the variations in trace length between the plug and the four pads and the test probe contacts to the pads.

The structure of FIG. 3 and the method just described are limited to measuring the cumulative resistance of the plug and the interfaces I1 and I2 shown in FIG. 1. No information is obtained from the test measurements that will indicate whether a resistance problem lies with either of the two interfaces I1 and I2 or with the plug itself. As a result, the source of a problem with the via resistance must be guessed at in what is usually an expensive and complex semiconductor fabrication process.

Accordingly, a need remains for a structure and method for obtaining separate resistance measurements for the plug and metal interfaces of an inter-metal layer via.

SUMMARY OF THE INVENTION

It is, therefore, an object of the invention to provide a circuit and method which can obtain individual measurements for a plug, and each of the metal-plug interfaces in an inter-metal layer via.

The foregoing and other objects, features and advantages of the invention will become more readily apparent from the following detailed description of a preferred embodiment of the invention which proceeds with reference to the accompanying drawings.

DETAILED DESCRIPTION

Figure 3:
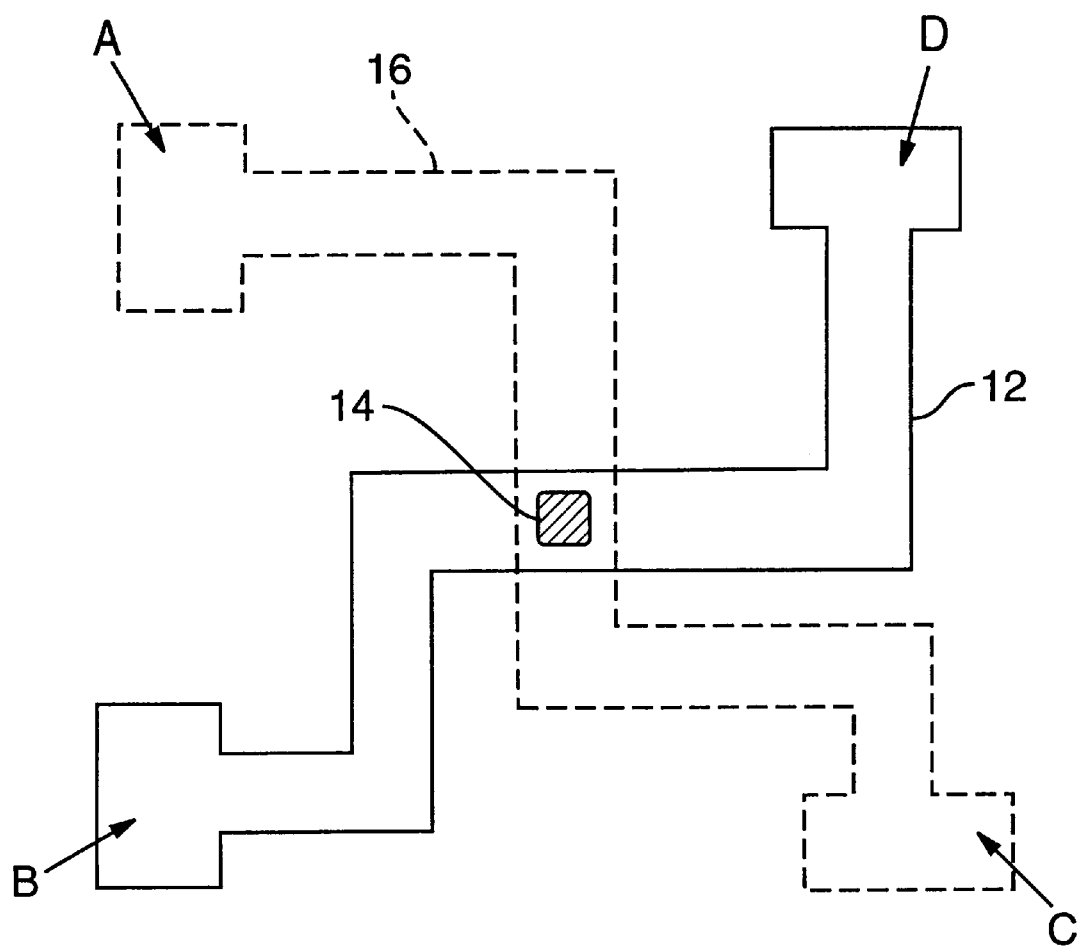
FIG. 3 is a top-view of a conventional structure for measuring the resistance of the inter-metal via of FIG. 1 according to the prior art.
Figure 4:
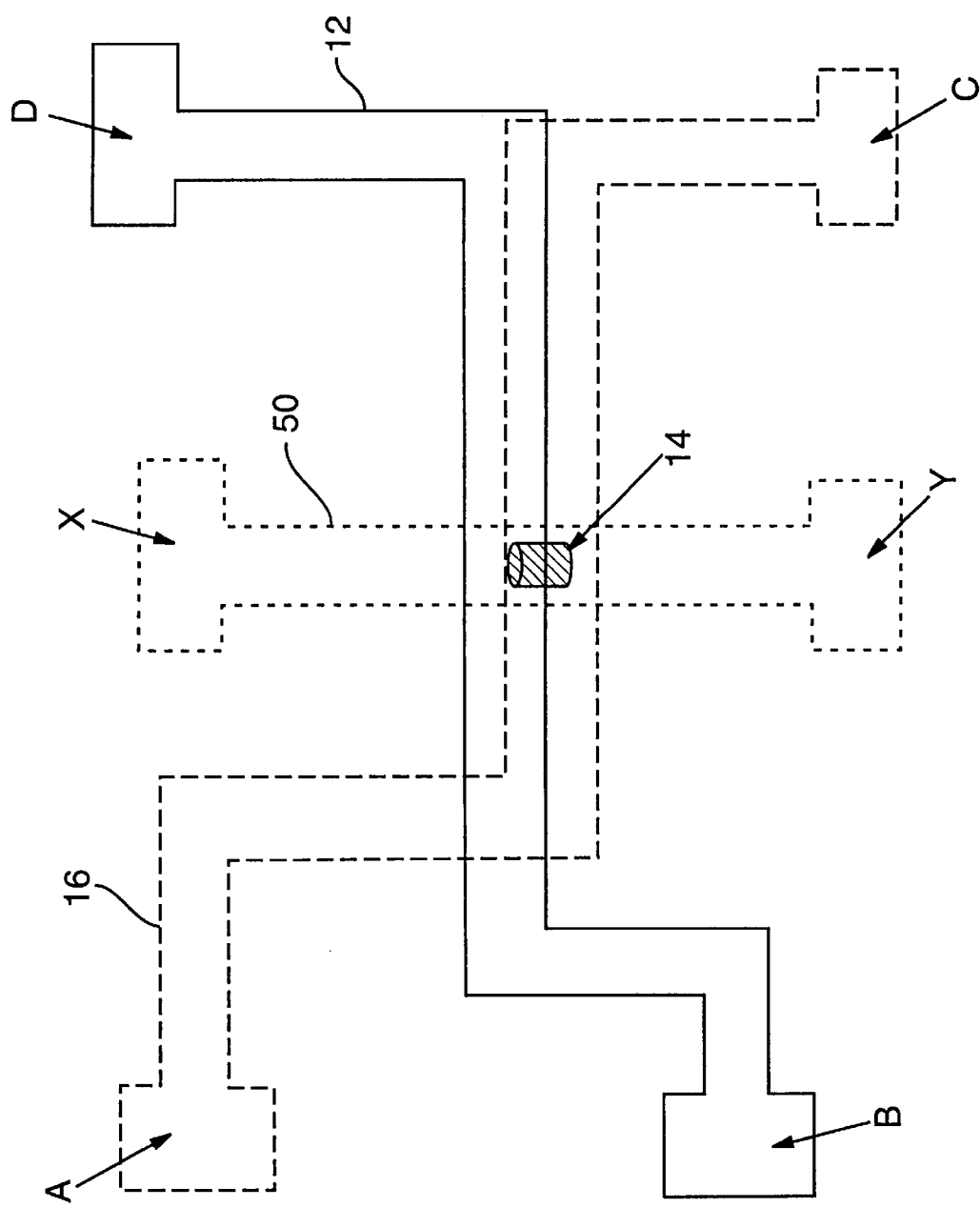
FIG. 4 is a perspective view of an embodiment of a structure for determining the resistance of interfaces in a via according to the present invention.

Referring now to FIG. 4, an embodiment of a structure according to the present invention for determining interface resistance of a via in a semiconductor device is shown. As in the conventional structure shown in FIG. 3, an M1 layer 16, which includes traces to pads A and C, is interconnected with an M2 layer 12, which includes traces to pads B and D, through a plug 14. However, in the present invention, a via layer conductive trace 50 is coupled to the plug 14 and to pads X and Y.

Figure 1:
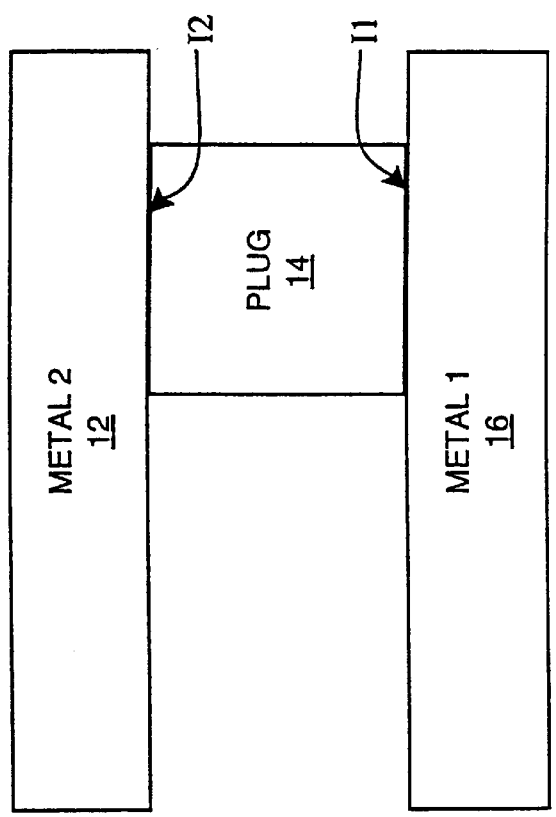
FIG. 1 is a cross-sectional diagram of a prior art inter-metal via.
Figure 2A:
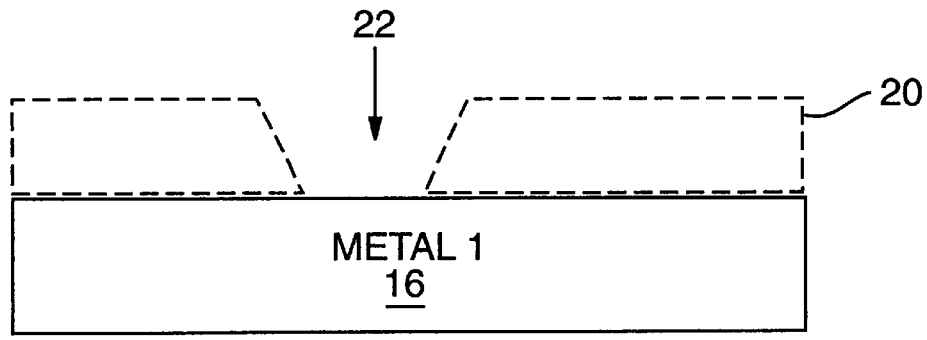
FIGS. 2A–C are cross-sectional drawings of various steps in the process of forming the via of FIG. 1 according to the prior art.
Figure 2B:
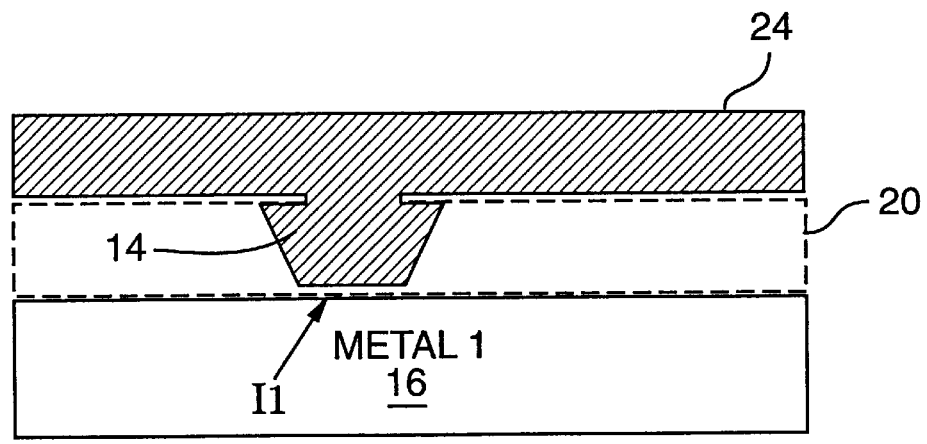
Figure 2C:
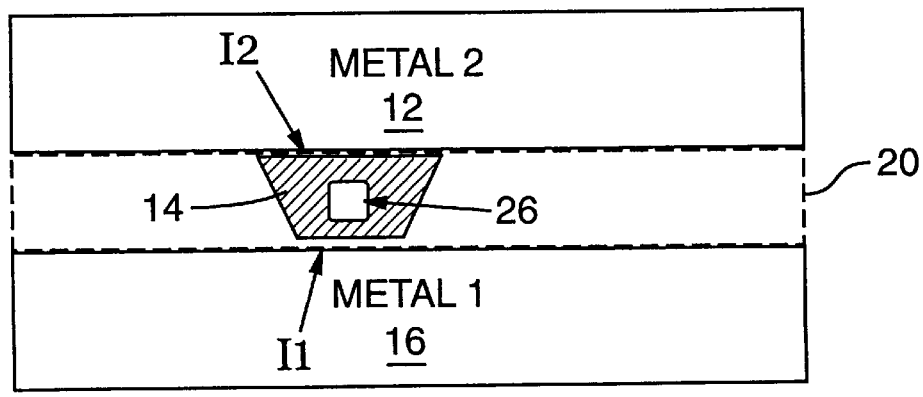

The via layer conductive trace 50 is formed by extending the trough 22 shown in FIG. 2A by etching a continuous trench in the IMD layer 20 out to pads X and Y which is then filled with tungsten 24 when plug 14 is formed in the step shown in FIG. 2B. Then the tungsten layer 24 is lapped or etched back leaving plug 14 and via layer conductive trace 50.

Figure 5:
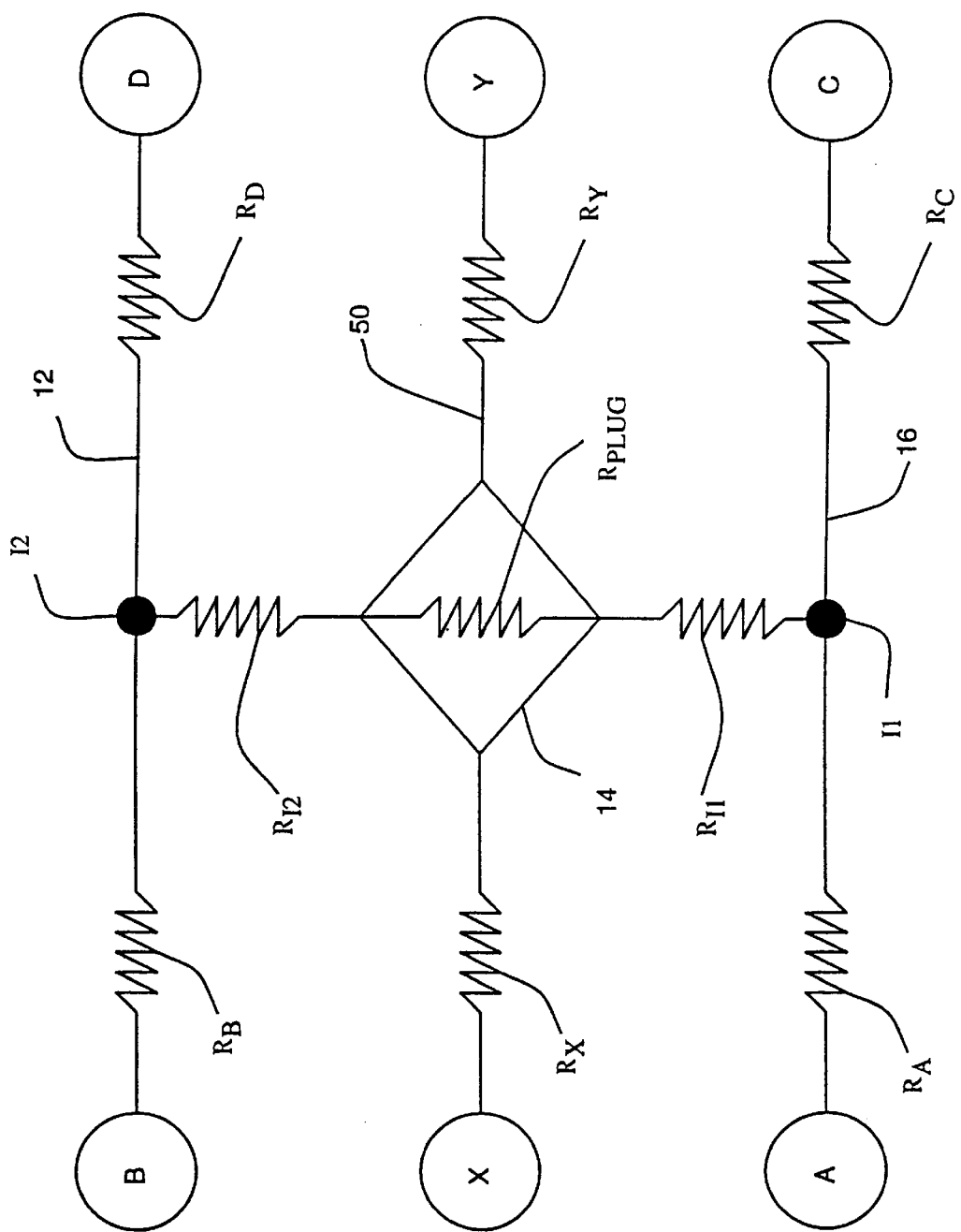
FIG. 5 is a circuit diagram corresponding to the structure of FIG. 4.

FIG. 5 shows a circuit diagram which corresponds to the structure of FIG. 4 and which represents the resistances present in the structure of the present invention. M2 layer 12 with traces running from interface I2 to pads B and D has resistances RB and RD, respectively, associated with the runs to those pads. Similarly, M1 layer 16 has traces running from interface I1 to pads A and C with resistances RA and RC, respectively, associated with the runs to those pads. Likewise, via layer conductive trace 50 has runs from plug 14 to pads X and Y with resistances RX and RY, respectively, associated with the runs to those pads. The resistance for interface I1 is represented by resistor RI1, the resistance for interface I2 is represented by resistor RI2, and the resistance of the plug 14 is represented by resistor RPLUG.

To measure the resistances RI1, RI2 and RPATH, a series of six measurements are made using the structure of FIG. 5. To obtain the resistance RI1 of interface I1, a current source is first coupled across pads A and Y and the voltage across pads C and X is measured. Then the current source is coupled across pads C and X and the voltage between pads A and Y is measured. The two measurements are then averaged to compensate for differences in the run resistances RC, RX, RA and RY. By dividing the measured voltage difference by the applied current, the resistance RI1 of interface I1 can be determined.

Similarly, to obtain the resistance RI2 of interface I2, a current source is first coupled across pads B and Y and the voltage across pads D and X is measured. Then the current source is coupled across pads D and X and the voltage between pads B and Y is measured. The two measurements are then averaged to compensate for differences in the run resistances RB, RY, RD and RX. By dividing the measured voltage difference by the applied current, the resistance RI2 of interface I2 can be determined.

Finally, the total resistance of plug 14, interface I1 and interface I2 is obtained by coupling the current source across pads B and C and measuring the voltage difference between pads A and D. Then the current source is coupled across pads A and D and the voltage between pads B and C is measured. The two measurements are then averaged to compensate for differences in the run resistances RB, RC, RA and RD. By dividing the measured voltage difference by the applied current, the total resistance of plug 14 and interfaces I1 and I2 can be determined. By subtracting the values of RI1 and RI2 obtained using the structure of the present invention from the total resistance of plug 14 and interfaces I1 and I2, the resistance value RPLUG of plug 14 can be determined.

With the structure and method of the present invention, the contact structure between metal layers can be fully characterized. Full characterization of the contact structure allows more precise troubleshooting of fabrication process problems which can result in significant savings both in terms of engineering time and processing costs. The total contact resistance measurement obtained through the structure and method of the present invention can be cross correlated with the commonly used four point Kelvin structure.

Having described and illustrated the principles of the invention in a preferred embodiment thereof, it should be apparent that the invention can be modified in arrangement and detail without departing from such principles. For instance, though the present invention is described in the context of a single plug and two metallization layers, the structure and method of the present invention is applicable in the context of a greater number of metallization layers and their associated vias. We claim all modifications and variations coming within the spirit and scope of the following claims.

I claim:

1. A semiconductor contact structure, the structure comprising:

a first conductive layer;

first and second pads coupled to the first conductive layer;

a second conductive layer;

third and fourth pads coupled to the second conductive layer;

a first dielectric layer disposed between the first and second conductive layers;

an inter-layer contact structure disposed in the first dielectric layer and coupled to the first and second conductive layers;

a conductive trace disposed within the first dielectric layer and coupled to the inter-layer contact structure; and fifth and sixth pads coupled to the conductive trace.

2. The semiconductor contact structure of claim 1, wherein the conductive trace is positioned apart from the first and second conductive layers so as to electrically isolate the conductive trace from the first and second conductive layers.

3. The semiconductor contact structure of claim 1, further including:

a second dielectric layer interposed the conductive trace and the first conductive layer; and a third dielectric layer interposed the conductive trace and the second conductive layer.

* * * * *